(12) United States Patent
Li et al.

(10) Patent No.: US 7,527,749 B2
(45) Date of Patent: *May 5, 2009

(54) ELECTRICALLY CONDUCTIVE ADHESIVES AND METHODS OF MAKING

(75) Inventors: Yi Li, Chandler, AZ (US); Kyoung-sik Moon, Duluth, GA (US); Ching Ping Wong, Berkely Lake, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 84 days.

This patent is subject to a terminal disclaimer.

(21) Appl. No.: 11/252,371

(22) Filed: Oct. 18, 2005

(65) Prior Publication Data

US 2006/0081820 A1    Apr. 20, 2006

Related U.S. Application Data

(60) Provisional application No. 60/619,891, filed on Oct. 18, 2004.

(51) Int. Cl.
*H01B 1/06* (2006.01)
*H01B 1/00* (2006.01)
*H01B 1/22* (2006.01)

(52) U.S. Cl. .................. 252/510; 252/500; 252/511; 252/513; 252/514

(58) Field of Classification Search ................ 252/500, 252/510, 511, 513, 514
See application file for complete search history.

(56) References Cited

U.S. PATENT DOCUMENTS

| | | | |
|---|---|---|---|
| 4,054,714 A | 10/1977 | Mastrangelo | 428/328 |
| 4,127,699 A | 11/1978 | Aumiller et al. | 428/461 |
| 4,548,879 A * | 10/1985 | St. John et al. | 428/195.1 |
| 4,574,056 A * | 3/1986 | Kimura | 252/514 |
| 4,983,456 A | 1/1991 | Iwaskow et al. | 428/254 |
| 5,064,469 A * | 11/1991 | Mack | 106/14.42 |
| 5,438,160 A | 8/1995 | Batty | 174/52.1 |
| 5,542,163 A | 8/1996 | Chang | 29/2 |
| 5,853,622 A * | 12/1998 | Gallagher et al. | 252/512 |
| 6,328,728 B1 | 12/2001 | Holladay et al. | 604/501 |
| 6,613,184 B1 | 9/2003 | Egitto et al. | 156/314 |
| 6,666,994 B2 * | 12/2003 | Takezawa et al. | 252/518.1 |
| 6,680,007 B2 * | 1/2004 | Honda et al. | 252/511 |
| 6,803,583 B2 | 10/2004 | Taylor | 250/397 |
| 6,916,433 B2 * | 7/2005 | Mitani et al. | 252/500 |
| 7,037,399 B2 * | 5/2006 | Tong et al. | 156/256 |
| 2002/0047109 A1 * | 4/2002 | Yoshida et al. | 252/500 |
| 2004/0062873 A1 * | 4/2004 | Jung et al. | 427/407.1 |
| 2004/0169162 A1 * | 9/2004 | Xiao et al. | 252/500 |
| 2006/0145125 A1 * | 7/2006 | Kuwajima et al. | 252/500 |
| 2006/0219985 A1 * | 10/2006 | Kuwajima | 252/500 |
| 2007/0051927 A1 * | 3/2007 | Itoh et al. | 252/500 |

FOREIGN PATENT DOCUMENTS

| | | | |
|---|---|---|---|
| JP | 58-160372 | * | 9/1983 |
| JP | 2000-322933 | * | 11/2000 |

* cited by examiner

*Primary Examiner*—Mark Kopec
*Assistant Examiner*—Jaison P Thomas
(74) *Attorney, Agent, or Firm*—Thomas, Kayden, Horstemeyer & Risley, LLP

(57) ABSTRACT

Modified electrically conductive adhesives and methods of preparation thereof, are disclosed.

9 Claims, 9 Drawing Sheets

ELECTRICALLY CONDUCTIVE ADHESIVES AND METHODS OF MAKING

CROSS-REFERENCE TO RELATED APPLICATION

This application claims priority to co-pending U.S. provisional application entitled, "Innovative Corrosion Inhibitors for ECAs on Leadfree Surfaces," having Ser. No. 60/619,891, filed Oct. 18, 2004, which is entirely incorporated herein by reference.

STATEMENT REGARDING FEDERALLY SPONSORED RESEARCH OR DEVELOPMENT

This invention was made with government support under the terms of DMI-0217910 awarded by the National Science Foundation of the U.S. Government and RD-83148901 awarded by the Environmental Protection Agency. The government has certain rights in the invention.

TECHNICAL FIELD

The present disclosure is generally related to adhesives and, more particularly, embodiments of the present disclosure are related to electrically conductive adhesives.

BACKGROUND

Recently, polymer based electrically conductive adhesives (ECAs) have been identified as potential alternative electronic interconnects to lead-containing solders in surface mount technology (SMT) applications due to the numerous advantages of ECAs, such as environmental friendliness, mild processing conditions, low stress on the substrates, and good thermomechanical performance. However, some technical barriers concerning the ECAs still restrict their use to only the low-end products (e.g., low power device interconnects). One critical limitation of ECAs that prevents their use for high end products is their unstable contact resistance on non-noble metals, such as Sn, Ni, Sn/Pb. The National Center of Manufacturing Science (NCMS) defined the stability criterion for solder replacement conductive adhesives as a contact resistance shift of less than 20% after aging at 85° C./85% RH conditions for 500 hours, which most conductive adhesives do not satisfy on non-noble metal finishes.

Previous studies indicated that galvanic corrosion was the dominant mechanism for the unstable contact resistance during elevated temperature and humidity aging. The non-noble metal (i.e., a metal with a lower electrochemical potential) acts as an anode and is oxidized to a metal ion ($M-ne^-=M^{n+}$) by losing electrons. The noble metal acts as a cathode, at which the reaction generally is $2H_2O+O_2+4e^-=4OH^-$. Then $M^{n+}$ combines with $OH^-$ to form a metal hydroxide, which is further oxidized to metal oxide. Thus, a layer of metal hydroxide or metal oxide, which is electrically insulating is formed at the interface, therefore causing the dramatic increase in contact resistance of the ECA as it ages.

Based on the mechanism of unstable contact resistance of ECAs, three methods have been applied to prevent the galvanic corrosion of the metal finishes. One is by using oxygen scavengers. Since oxygen accelerates galvanic corrosion, oxygen scavengers could be added into ECAs to slow down the corrosion rate. When ambient oxygen molecules diffuse through the polymer binder, they react with the oxygen scavenger and are consumed. However, when the oxygen scavenger within the ECA is depleted, then oxygen can again diffuse into the interface and accelerate the corrosion process. Therefore, oxygen scavengers can only delay the galvanic corrosion process, but do not solve the corrosion problem.

Another method is to incorporate sacrificial materials with lower electrochemical potential than those of the electrode-metal pads into the ECA. At elevated temperature and high humidity, the sacrificial materials are preferably corroded, and thus, can protect the metal finishes.

Another method to stabilize contact resistance of an ECA is the use of corrosion inhibitors in ECA formulations. In general, organic corrosion inhibitors are chemicals that adsorb on metal surfaces and act as a barrier layer between the metal and the environment by forming a film over the metal surfaces. Thus, the metal finishes can be protected. Some chelating compounds are especially effective in preventing metal corrosion. However, the effectiveness of the corrosion inhibitors is highly dependent on the type of contact surfaces. Although some effective corrosion inhibitors have been developed for Sn/Pb, Cu, and Al surfaces, no corrosion inhibitors for a tin (Sn) surface have been reported.

Recently, Sn has been widely accepted as a surface finish for substrate bond pads in lead-free solder joints due to its low cost and a simple process for the Sn surface finish fabrication. In addition, ECA joints with Sn are less susceptible to Sn whiskering, compared to Sn alloy solder joints. However, tests showed that conventional ECAs/Sn joints exhibited considerably unstable contact resistance at early stages under aging environment. Therefore, the development of effective corrosion inhibitors for a Sn surface is of great significance and interest within the art.

SUMMARY

Modified electrically conductive adhesives and methods of making are disclosed. A representative embodiment of a composition, among others, includes an electrically conductive adhesive (ECA) and a corrosion inhibitor additive. The cured composition has a contact resistance that changes less than about 20% after 500 hours' aging at 85° C./85% relative humidity.

Another representative embodiment of a modified electrically conductive adhesive, among others, includes: a matrix resin, a cross-linking agent, a conductive filler, and a corrosion inhibitor. The corrosion inhibitor is selected from the following formulas: R1—COOH, HOOC—R2—COOH,

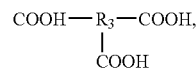

and R4C(H)(NH$_2$)—COOH. R1, R2, R3, and R4 are each independently selected from a substituted or unsubstituted, saturated or unsaturated, aliphatic hydrocarbon radical; a substituted or unsubstituted aromatic hydrocarbon radical; a substituted or unsubstituted cycloaliphatic hydrocarbon radical; and a substituted or unsubstituted aryaliphatic hydrocarbon radical.

BRIEF DESCRIPTION OF THE DRAWINGS

Many aspects of this disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1A:
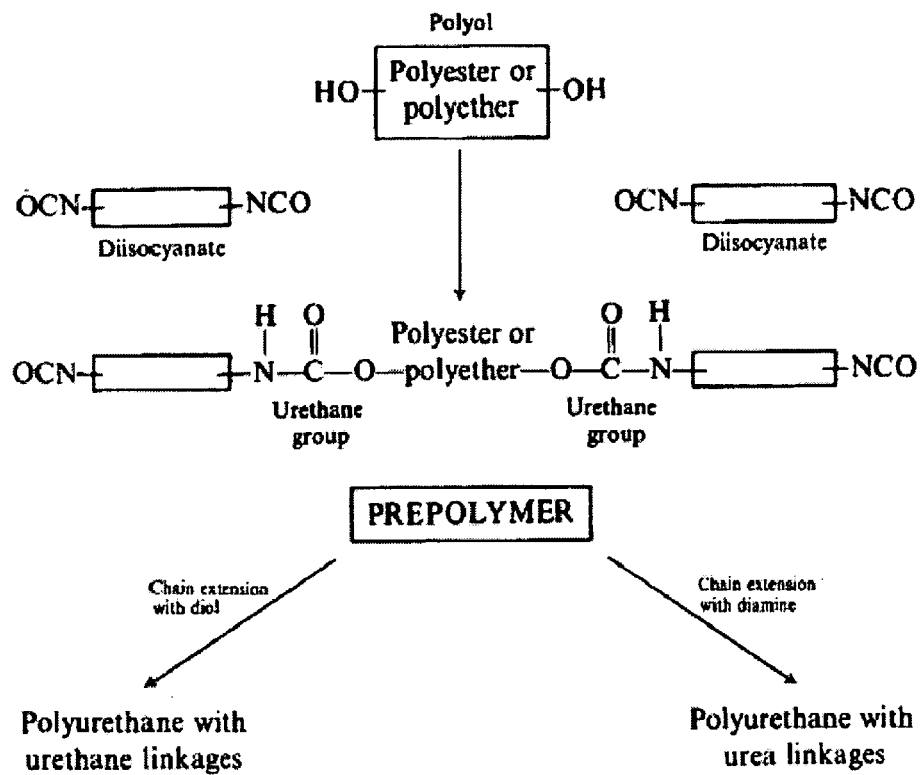
FIGS. 1A through 1C illustrate embodiments of various chemicals.

Before the embodiments of the present disclosure are described in detail, it is to be understood that unless otherwise indicated the present disclosure is not limited to particular materials, reagents, reaction materials, manufacturing processes, or the like, as such may vary. It is also to be understood that the terminology used herein is for purposes of describing particular embodiments only, and is not intended to be limiting. It is also possible in the present disclosure that steps may be executed in different sequence where this is logically possible.

It must be noted that, as used in the specification and the appended claims, the singular forms "a," "an" and "the" include plural referents unless the context clearly dictates otherwise.

Definitions

The terms "aliphatic hydrocarbon" and "alkyl" refer to straight or branched chain, substituted or unsubstituted, hydrocarbon groups having 1 to 26, 1 to 15, 1 to 12, 1 to 6, and 8 to 12 carbon atoms, such as methyl, ethyl, n-propyl, i-propyl, n-butyl, i-butyl, t-butyl, pentyl, hexyl, heptyl, octyl, and the like.

"Unbranched" refers to a structure where the carbon chain does not have any tertiary or quaternary aliphatic carbon atoms.

"Branched" refers to those carbon chains having at least one tertiary or quaternary aliphatic carbon atom.

As used herein, the term "substituted" is used to refer, generally, to a carbon or suitable heteroatom having a hydrogen or other atom removed and replaced with a further moiety. Moreover, it is intended that the term "substituted" refers to substitutions that do not change the basic and novel utility of the underlying compounds, products, or compositions of the present disclosure.

The term "substituted alkyl" refers to alkyl groups substituted with one or more groups, preferably selected from aryl, substituted aryl, heterocyclo, substituted heterocyclo, carbocyclo, substituted carbocyclo, halo, hydroxy, alkoxy (optionally substituted), aryloxy (optionally substituted), alkylester (optionally substituted), arylester (optionally substituted), alkanoyl (optionally substituted), aroyl (optionally substituted), cyano, nitro, amino, substituted amino, amido, lactam, urea, urethane, sulfonyl, and the like.

The term "cycloalkyl" or "cycloaliphatic hydrocarbon" refers to a saturated hydrocarbon ring group having from 3 to 12 or from 3 to 8 carbon atoms, and includes, for example, cyclopropyl, cyclobutyl, cyclohexyl, methylcyclohexyl, cyclooctyl, and the like. Typically, however, cycloalkyl species contain 5 or 6 carbon atoms.

The term "aromatic hydrocarbon" refers to aromatic homocyclic (i.e., hydrocarbon) mono-, bi- or tricyclic ring-containing groups preferably having 6 to 12 members.

The term "arylaliphatic hydrocarbon" refers to cyclic hydrocarbon (e.g., mono-, bi- or tricyclic ring-containing groups) having 6 to 12 members such as phenyl, naphthyl and biphenyl arylaliphatic hydrocarbon.

The term "substituted aryl" refers to aryl groups substituted with one or more groups, preferably selected from alkyl, substituted alkyl, alkenyl (optionally substituted), aryl (optionally substituted), heterocyclo (optionally substituted), halo, hydroxy, alkoxy (optionally substituted), aryloxy (optionally substituted), alkanoyl (optionally substituted), aroyl, (optionally substituted), alkylester (optionally substituted), arylester (optionally substituted), cyano, nitro, amino, substituted amino, amido, lactam, urea, urethane, sulfonyl, etc., where optionally one or more pair of substituents, together with the atoms to which they are bonded, form a 3 to 7 member ring.

The terms "heterocycle", "heterocyclic", "heterocyclic group" or "heterocyclo" refer to fully saturated or partially or completely unsaturated, including aromatic ("heteroaryl") or nonaromatic cyclic groups (for example, 3 to 13 member monocyclic, 7 to 17 member bicyclic, or 10 to 20 member tricyclic ring systems, preferably containing a total of 3 to 10 ring atoms) which have at least one heteroatom in at least one carbon atom-containing ring. Each ring of the heterocyclic group containing a heteroatom may have 1, 2, 3 or 4 heteroatoms selected from nitrogen atoms, oxygen atoms and/or sulfur atoms, where the nitrogen and sulfur heteroatoms may optionally be oxidized and the nitrogen heteroatoms may optionally be quaternized. The heterocyclic group may be attached at any heteroatom or carbon atom of the ring or ring system. The rings of multi-ring heterocycles may be either fused, bridged, and/or joined through one or more spiro unions.

The terms "substituted heterocycle", "substituted heterocyclic", "substituted heterocyclic group" and "substituted heterocyclo" refer to heterocycle, heterocyclic and heterocyclo groups substituted with one or more groups preferably selected from alkyl, substituted alkyl, alkenyl, oxo, aryl, substituted aryl, heterocyclo, substituted heterocyclo, carbocyclo (optionally substituted), halo, hydroxy, alkoxy (optionally substituted), aryloxy (optionally substituted), alkanoyl (optionally substituted), aroyl (optionally substituted), alkylester (optionally substituted), arylester (optionally substituted), cyano, nitro, amido, amino, substituted amino, lactam, urea, urethane, sulfonyl, and the like, where optionally one or more pair of substituents, together with the atoms to which they are bonded, form a 3 to 7 member ring.

The terms "halogen" and "halo" refer to fluorine, chlorine, bromine and iodine.

"Optional" or "optionally" indicates that the subsequently described event or circumstance may or may not occur and that the description includes instances where said event or circumstance occurs and instances where it does not. For example, the phrase "optionally substituted alkyl group" means that the alkyl group may or may not be substituted and that the description includes both unsubstituted alkyl and alkyl where there is substitution.

Discussion

Modified electrically conductive adhesives (MECAs) and methods of making MECAs, are disclosed. The MECAs include a corrosion inhibitor additive. The MECAs of the present disclosure are capable of being used to bond electrical components in power, ground, and signal transmissions in electrical packaging. In short, the MECAs could replace tin/lead solder in electrical packaging. For example, the MECAs of the present disclosure can find application in interconnection technologies such as, but not limited to, pin-through-hole (PTH), surface mount technology (SMT), ball grid array (BGA, chip scale package (CSP)), and flip chip technology. The MECAs of the present disclosure can find application in consumer electronic devices such as, but not limited to, computers, video displays, cell phones, pagers, PDAs, electronic toys, electronic gaming machines, and the like.

The MECAs of the present disclosure are advantageous because they are environmentally friendly, relatively inexpensive, easy to process, low thermo-mechanical stress, and fine pitch capability. In addition, embodiments of the MECAs may provide superior characteristics over currently used MECAs. For example, after curing MECAs of the present disclosure have higher conductivity, lower bulk resistivity, a lower contact resistance shift over time, a higher glass transition temperature, enhanced mechanical properties, and a lower coefficient of thermal expansion (CTE).

The MECAs of the present disclosure include, but are not limited to, an ECA and a corrosion inhibitor additive. The ECA can be one of many commercial ECAs known in the art such as, but not limited to, Emerson & Cumming conductive adhesives (XCE 3050, epoxy based conductive adhesives with Ag flakes), Ablestick conductive adhesives (8175, epoxy based conductive adhesives with Ag flakes), 3M™ electrically conductive adhesives 9703, 9713, DowCorning conductive adhesives, and combinations thereof (e.g., silicone-based dimethysiloxane, methyphenylsiloxane, diphenylsiloxane, methytrifluorosiloxane, or silicone-epoxy copolymer loaded with silver flakes).

Although not intending to be bound by theory, the corrosion inhibitor additive can act as a barrier layer between the metal surface and the environment by forming a film over the metal surfaces and therefore reducing or preventing corrosion of the metal over an extended time frame. In general, the corrosion inhibitor additive is a material that reduces or prevents the oxidation and corrosion of metal surfaces and stabilizes contact resistance of MECAs during elevated temperature and humidity.

The MECA has enhanced characteristics relative to some currently used ECAs after curing the MECA. The characteristics include, but are not limited to, contact resistance shift, bulk resistivity, coefficient of thermal expansion, glass transition temperature, curing temperature, storage modulus G', loss modulus G", Young's modulus, fracture toughness, flexural strain at break, flexural strength, adhesion strength, viscosity, moisture absorption, and thermal stability. It should be noted that selection of the components of the MECA can alter the values of the characteristics and, therefore, the MECAs can be designed for particular applications.

Embodiments of the MECA can have a bulk resistivity from about $10^{-2}$ Ohm-cm to $10^{-6}$ Ohm-cm, about $10^{-2}$ Ohm-cm to $10^{-5}$ Ohm-cm, about $10^{-2}$ Ohm-cm to $10^{-4}$ Ohm-cm, and about $10^{-3}$ Ohm-cm to $10^{-4}$ Ohm-cm.

Embodiments of the MECA can have a contact resistance that changes less than about 30% after 500 hours' aging at 85° C./85% relative humidity, less than about 20% after 500 hours' aging at 85° C./85% relative humidity, less than about 15% after 500 hours' aging at 85° C./85% relative humidity, and less than about 10% after 500 hours' aging at 85° C./85% relative humidity. In addition, the MECA can have a contact resistance that changes less than about 2 to 20% after 500 hours' aging at 85° C./85% relative humidity, less than about 2 to 15% after 500 hours' aging at 85° C./85% relative humidity, and less than about 2 to 10% after 500 hours' aging at 85° C./85% relative humidity.

Embodiments of the MECA can have a coefficient of thermal expansion (CTE) before the glass transition temperature (Tg) is reached (α1) or (CTE α1) of about 10 parts per million (ppm)/° C. to 80 ppm/° C., about 15 parts per million (ppm)/° C. to 80 ppm/° C., about 20 parts per million (ppm)/° C. to 80 ppm/° C., about 10 parts per million (ppm)/° C. to 70 ppm/° C., about 10 parts per million (ppm)/° C. to 60 ppm/° C., about 10 parts per million (ppm)/° C. to 50 ppm/° C., about 10 parts per million (ppm)/° C. to 40 ppm/° C., about 10 parts per million (ppm)/° C. to 30 ppm/° C., about 10 parts per million (ppm)/° C. to 25 ppm/° C., and about 15 parts per million (ppm)/° C. to 25 ppm/° C.

Embodiments of the MECA can have a glass transition temperature (Tg) about 80° C. to 200° C., about 100° C. to 200° C., about 120° C. to 200° C., about 140° C. to 200° C., about 160° C. to 200° C., and about 180° C. to 200° C.

Embodiments of the MECA can have a curing temperature from about 70° C. to 250° C., about 100° C. to 220° C., and about 120° C. to 200° C.

Embodiments of the MECA can have storage modulus G' of about 1 to 12 GPas, about 2 to 8 GPa, and about 2 to 5 GPa.

Embodiments of the MECA can have loss modulus G" of about 50 to 500 MPa.

Embodiments of the MECA can have Young's modulus of about 2.8 to 34 GPa, about 5.6 to 22 GPa, and about 5.6 to 14 GPa.

Embodiments of the MECA can have fracture toughness of about 0.8 to 3 MPa·m$^{-1/2}$ for the stress intensity factor ($K_1C$).

Embodiments of the MECA can have flexural strain at break of about 5 to 10%.

Embodiments of the MECA can have flexural strength of about 150 to 250 MPa.

Embodiments of the MECA can have adhesion strength of about 10 to 90 MPa/cm.

Embodiments of the MECA can have viscosity of about 0.3 Pa·s to thousands of Pa·s. It should be noted that viscosity strongly depends on the resin and loading level of conductive fillers.

Embodiments of the MECA can have moisture absorption of about 0.1 to 3 wt % and about 0.5 to 1.5 wt %.

Embodiments of the MECA can have thermal stability of about 100 to 600° C., about 100 to 400° C., and about 100 to 300° C.

The ECA can include, but is not limited to, a matrix resin, a cross-linking agent, and conductive fillers. The corrosion inhibitor additive can be added to the ECA to form the MECA. The matrix resin can include, but is not limited to, an epoxy resin, a cyanate ester, polyimide, silicone, polyurethane, and other thermoplastics (e.g., preimidized polyimides, maleimides, hot melt thermoplastics and the like), silicone-epoxy blends, thermosets, thermoset-thermoplastic blends, and combinations thereof. In addition, the ECA can include other components such as, but not limited to, a curing accelerator, an adhesion promoter, a corrosion inhibitor, and the like.

The epoxy resin can include, but is not limited to, bisphenol-A type epoxy resins, bisphenol-F type epoxy resins, cycloaliphatic epoxy resins, epoxy novolac resins, biphenyl type epoxy resins, naphthalene type epoxy resins, dicyclopentadiene-phenol type epoxy resins, and combinations thereof.

Figure 1B:
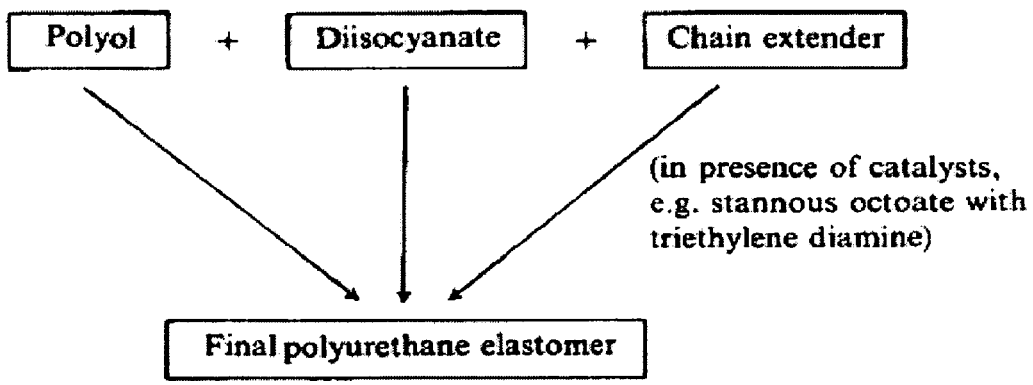
Figure 1C:
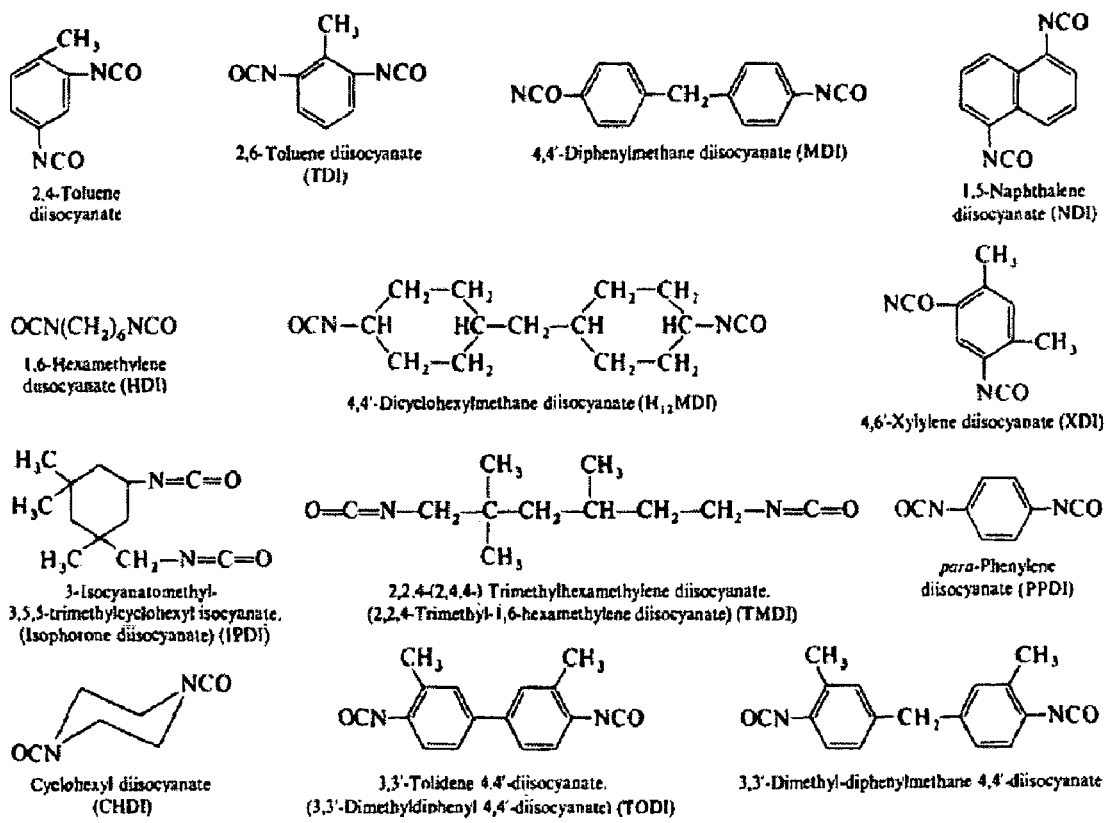

The cyanate ester can include, but is not limited to, those shown in FIGS. 1A-1C. The polyurethane can include, but is not limited to, those shown in FIGS. 1A-1C.

The polyimide, silicone can include, but is not limited to, phenylene pyromellitimide dianhydride (PMDA-ODA), PMDA benzidine, oxydiphthalic dianhydride (ODPA), dimethysiloxane, methyphenylsiloxane, diphenylsiloxane, methytrifluorosiloxane, silicone-epoxy copolymer, and combinations thereof.

The thermoplastics can include, but are not limited to, preimidized polyimides, maleimides, hot melt thermoplastics, and combinations thereof.

The thermoset polymers can include, but are not limited to, epoxies, polyimides, cyanate ester, silicones, and combinations thereof.

The silicone-epoxy blends can include blends such as, but not limited to, dimethysiloxane, methyphenylsiloxane, diphenylsiloxane, trifluoro-methysiloxane, trifluorophenylsiloxane with any epoxy functional groups, and combinations thereof.

The matrix resin is about 2 to 99 by weight percent of the MECA, about 2 to 60 by weight percent of the MECA, about 20 to 80 by weight percent of the MECA, and about 40 to 99 by weight percent of the MECA.

The conductive filler can include, but is not limited to, a metal (e.g., silver, nickel, copper, aluminum, palladium, platinum, gold, combinations thereof, and alloys thereof), a carbon black, a carbon fiber, a carbon nanotube, graphite, and combinations thereof. The conductive filler can have particle sizes in the range of about 0.01 micrometers to about 50 micrometers, and about 1 micrometer to about 10 micrometers. The conductive filler is about 5 to 95 by weight percent of the MECA, about 5 to 85 by weight percent of the MECA, and about 60 to 90 by weight percent of the MECA.

The cross-linking agent can include compounds suitable for hardening the MECA composition such as, but not limited to, amines (e.g., tertiary amines, aliphatic amines, and aromatic amines), anhydrides (e.g., carboxylic acid anhydrides), thiols, alcohols, phenols, isocyanates, boron complexes, inorganic acids, hydrazides, and imidazoles. In addition, the hardener can include derivatives of the compounds listed above for the cross-linking agent. The cross-linking agent is about 2 to 50 by weight percent of the MECA, about 5 to 90 by weight percent of the MECA, and about 30 to 100 by weight percent of the MECA.

The corrosion inhibitor additive can include, but is not limited to, a carboxylic acid, an amino acid or derivative thereof, and combinations thereof. The carboxylic acid can include, but is not limited to, a primary carboxylic acid, a secondary carboxylic acid, and a tertiary carboxylic acid. In particular, the carboxylic acids can include, but are not limited to, malonic acid, glutaric acid, adipic acid, heptanoic acid, terephthalic acid, and dodecanedioic acid. The amino acids can include, but are not limited to, glycine, lysine, and aspartic acid, and their derivatives.

In addition, the corrosion inhibitor additive can include, but is not limited to, compounds having the formula R1—COOH, the formula HOOC—R2—COOH, the formula

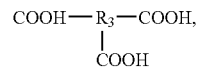

and the formula R4C(H)(NH$_2$)—COOH.

Each of R1, R2, R3, and R4 are independently selected from a substituted or unsubstituted, saturated or unsaturated, aliphatic hydrocarbon radical; a substituted or unsubstituted aromatic hydrocarbon radical; a substituted or unsubstituted cycloaliphatic hydrocarbon radical; and a substituted or unsubstituted aryaliphatic hydrocarbon radical. In an embodiment, the molecular length of the corrosion inhibitor additive is less about than 50 Å, less than about 40 Å, and less than about 30 Å.

The compounds having the formula R1—COOH can include, but are not limited to, propanoic acid, benzoic acid, lactic acid, formic acid, acrylic acid, and combinations thereof.

The compounds having the formula HOOC—R2—COOH can include, but are not limited to, oxalic acid, malonic acid, glutaric acid, adipic acid, terephthalic acid, maleic acid, fumaric acid, dodecanedioic acid, and combinations thereof.

The compounds having the formula

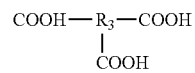

can include, but are not limited to, phosphonobutanetricarboxylic acid, benzenetricarboxylate, and combinations thereof.

The compounds having the formula R4C(H)(NH$_2$)—COOH can include, but are not limited to, glycine, lysine, aspartic acid, valine, glutamic acid, valine, and combinations thereof.

The corrosion inhibitor additive is about 0.01 to 20 by weight percent of the MECA, about 0.1 to 15 by weight percent of the MECA, about 0.1 to 12 by weight percent of the MECA, and about 0.1 to 8 by weight percent of the MECA.

The curing accelerator can be selected from, but is not limited to, a triphenylphosphine, alkyl-substituted imidazoles, imidazolium salts, onium borates, metal chelates or a mixture thereof. The curing accelerator is present in an amount from about 0 to 10 weight percent of the MECA and about 0 to 2 weight percent of the MECA.

The adhesion promoter is a material that promotes adhesion between the substrate and the adhesives. Exemplary adhesion promoters include, but are not limited to, organafunctional saline adhesion promoters. The adhesion promoter material is present in an amount of about 0 to 10 weight percent of the MECA and about 0.1 to 2 weight percent of the MECA.

The corrosion inhibitor is a material that prevents oxidation and corrosion of metal surfaces and stabilizes contact resistance of electrically conductive adhesives during elevated temperature and humidity. Exemplary corrosion inhibitors include, but are not limited to, chelating compounds, imidazole derivatives, phenyl- substituted imidazole, benzo-triazole and its derivatives, and acids. The corrosion inhibitor material is present in an amount of about 0.01 to 10 weight percent of the MECA and about 0.1 to 3 weight percent of the MECA.

The components of the MECA can be mixed and applied to a substrate to which solder can be disposed, and then cured. The curing can be performed at about 120 to 160° C. for about 60 to 90 minutes. The cured MECA has the characteristics as described above.

Now having described the MECAs in general, examples of possible embodiments of the ECAs will be discussed. While embodiments of the MECAs are described in connection with the example and the corresponding text and figures, there is no intent to limit embodiments of the MECAs to these descriptions. On the contrary, the intent is to cover all alternatives, modifications, and equivalents included within the spirit and scope of embodiments of the present disclosure.

It should be emphasized that the above-described embodiments of the present disclosure are merely possible examples of implementations and are merely set forth for a clear understanding of the principles of the disclosure. Many variations and modifications may be made to the above-described embodiments. All such modifications and variations are intended to be included herein within the scope of this disclosure and protected by the following claims.

EXAMPLE

In this Example, effective organic compounds were introduced into a typical ECA formulation (to from MECAs), and the contact resistance of the MECAs on Sn surfaces with the organic compounds under 85° C./85% RH aging are presented. With the incorporation of small amounts of these additives, lower bulk resistivity and highly stable contact resistance on tin (Sn) surfaces were achieved. In addition, the roles of these additives were investigated by contact angle, grazing angle Fourier Transfer Infrared (FTIR) spectroscopy, X-ray Photoelectron Spectroscopy (XPS) and X-ray diffraction (XRD) techniques. These results showed the presence of coatings of the corrosion inhibitors on the metal surfaces. A barrier passivation layer formed on the Sn surfaces with the effective corrosion inhibitors. X-ray diffraction analysis confirmed that such a passivation layer protected the Sn surface and prevented oxidation and corrosion under an elevated temperature and humidity environment. The mechanism for the contact resistance stabilization on Sn surfaces was discussed.

Experimental

Materials: A bisphenol-F type epoxy from Shell Chemical Company and an anhydride hardener from Lindau Chemicals, Inc (Columbia, N.C., USA) were used. The ratio of epoxy to hardener was 1:0.85, based on the epoxide equivalent weight (EEW) of the epoxy resin and the anhydride equivalent weight of the hardener. An imidazole type catalyst from Shikoku Chemicals Corporation (Japan) was employed. Two types of silver flakes, with particle sizes of 1.5-5 and 0.8-2.0 µm were donated by Ferro Co. and incorporated by 80 wt % with 1:1 ratio in the ECA formulations. Four different types of additives, glycine (aa1), lysine (aa2), aspartic acid (aa3), and dodecanedioic acid (aa4), with either —$NH_2$ or —COOH functional groups, were purchased from Aldrich Chemical Company. The additives were incorporated in the ECA formulations and then mixed uniformly. All chemicals were used as received.

Curing Behavior of the ECAs: The curing behavior of the MECAs was determined using a modulated differential scanning calorimeter (MDSC from TA Instruments, model 2970). A sample of about 10 mg was placed into a hermetically sealed DSC sample pan and placed in the DSC cell under a 40 ml/min nitrogen purge. A dynamic scanning mode was used at a heating rate of 5° C./minute, usually from 25° C. to 250° C.

Measurement of Resistivity of Conductive Adhesives: The resistivity of the ECAs was calculated from the bulk resistance of the specimen with specific dimensions. Two strips of an adhesive tape were applied onto a pre-cleaned glass slide with a gap of 6.62 mm between these two strips. The conductive adhesive paste was then printed on the glass slide, and then the tapes were removed. After cure, the bulk resistance (R) of this ECA strip was measured, as well as the size of the specimen. The bulk resistivity, ρ, was calculated using the following equation:

$$\rho = \frac{t \times w}{l} \times R$$

where l, w, t are the length, width and thickness of the sample, respectively.

Study of Contact Resistance Shift during 85° C./85% RH Aging: Contact resistance was measured using an in-house made test coupon with a Sn finish (D. Lu, Q. K. Tong, and C. P. Wong, *IEEE Trans. CPMT*, Part C, 22, 228-232 (1999)). The specimens were exposed to 85° C./85% RH (using an accelerated temperature and humidity chamber from Lunaire Environmental, model CE0932W-4). The contact resistance of each specimen was measured periodically with a Keithley 2000 multimeter during aging.

Study of Adsorption and Inhibition Effects of Corrosion Inhibitors on Sn Finish: The corrosion inhibitor solutions were prepared at 10.0 mM by dissolving the additives in suitable solvents. The Sn surfaces were prepared by sputtering the metal on glass slides, cleaned by rinsing these surfaces with the isopropyl alcohol, and dried under the hood. 15 ml of each solution was used to treat the pre-cleaned Sn surfaces. After treatment for 24 hours, the samples were removed from the solutions and rinsed with the solvent in order to remove un-adhered additives. The Sn surfaces were then dried under argon environment. The contact angle of a deionized (DI) water droplet on the Sn surfaces was measured by a goniometer.

Grazing angle FTIR (Thermo Co. Woburn, Mass., USA) spectroscopy was used for characterizing additive coatings on Sn surfaces. Grazing angle FTIR spectra were acquired using a nitrogen purged, Nexus 670 spectrometer equipped with an MCT-A detector and a SAGA (Smart Aperture Grazing Angle) accessory. Spectra were collected at a 4 $cm^{-1}$ spectral resolution. A clean reference Sn finished slide was used as control to collect the background spectrum.

A surface Science Model SSX-100 Small Spot ESCA Spectrometer equipped with AlKα source was used to characterize and record the spectra of untreated and treated Sn surfaces. The fitting of the spectra was done by a non-linear least squares procedure provided by Service Physics (Bend, Oreg.). X-ray diffraction was used for phase characterization of untreated and treated Sn surfaces before and after aging.

Results and Discussion

Figure 2:
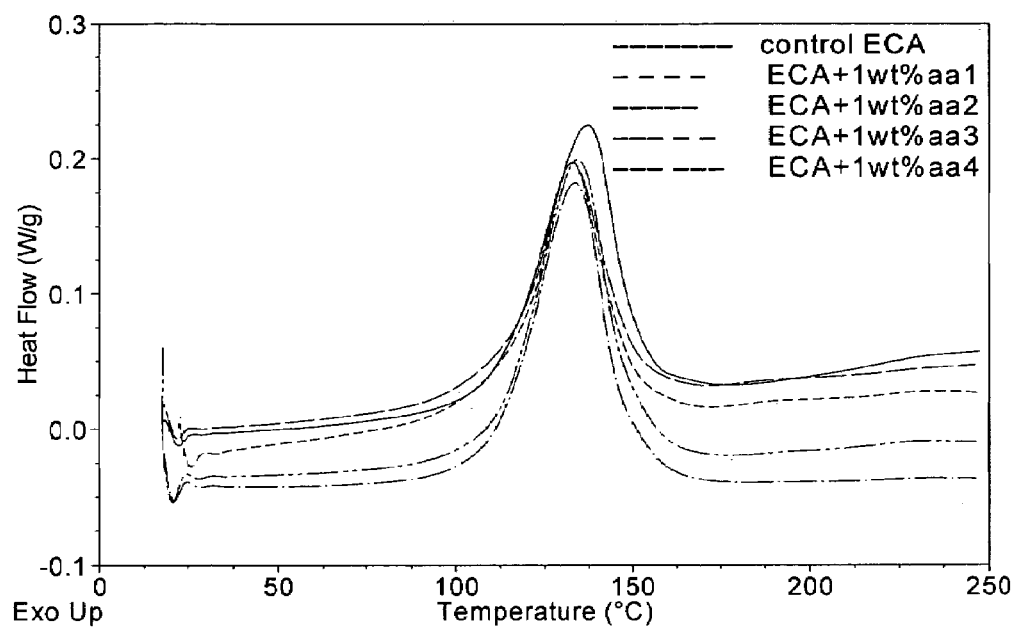
FIG. 2 illustrates curing profiles of ECAs with different additives.

Curing Behavior: The curing profiles of these formulated MECAs with 1 wt % additives are illustrated in FIG. 2. All the formulations showed similar curing behavior and had curing peaks in the temperature range from 120 to 150° C. The total reaction heat of the MECAs decreased slightly after the addition of additives (Table 1), which may be due to the premature reaction between the additives and silver flakes.

TABLE 1

DSC peak temperatures and reaction heats of MECAs with different additives

| Formulation | Peak temperature (° C.) | Reaction heat (J/g) |
|---|---|---|
| ECA control | 139 | 76.8 |
| MECA with 1 wt % aa1 | 133 | 60.9 |
| MECA with 1 wt % aa2 | 137 | 66.3 |
| MECA with 1 wt % aa3 | 134 | 70.7 |
| MECA with 1 wt % aa4 | 133 | 55.9 |

Figure 3:
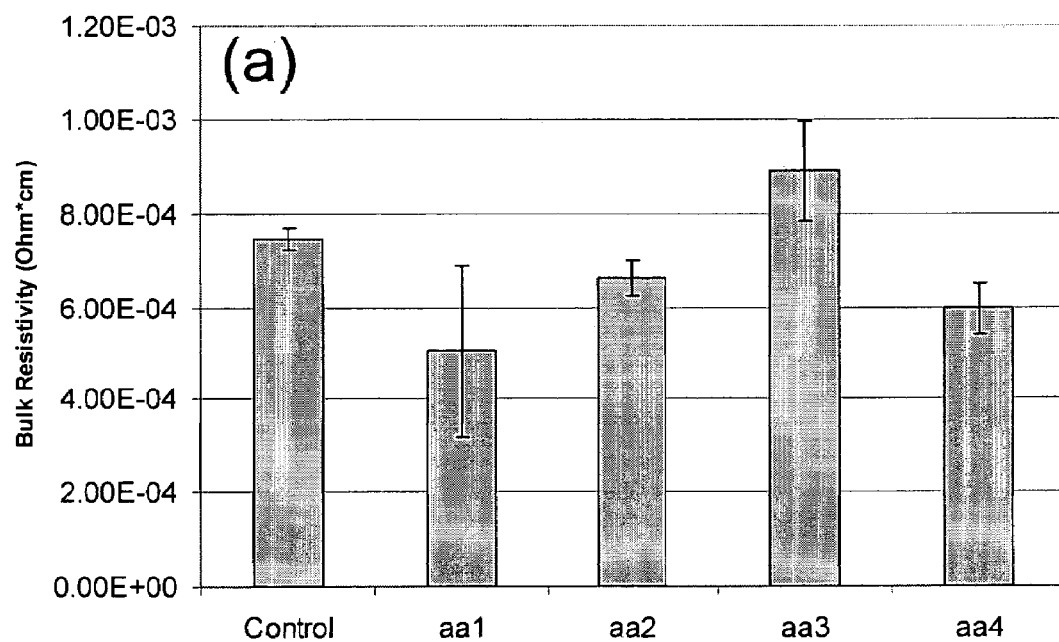
FIG. 3 illustrates (a) the bulk resistivity of ECAs with 1 wt % different additives and (b) with different amounts of glycine and dodecanedioic acid.
Figure 3:
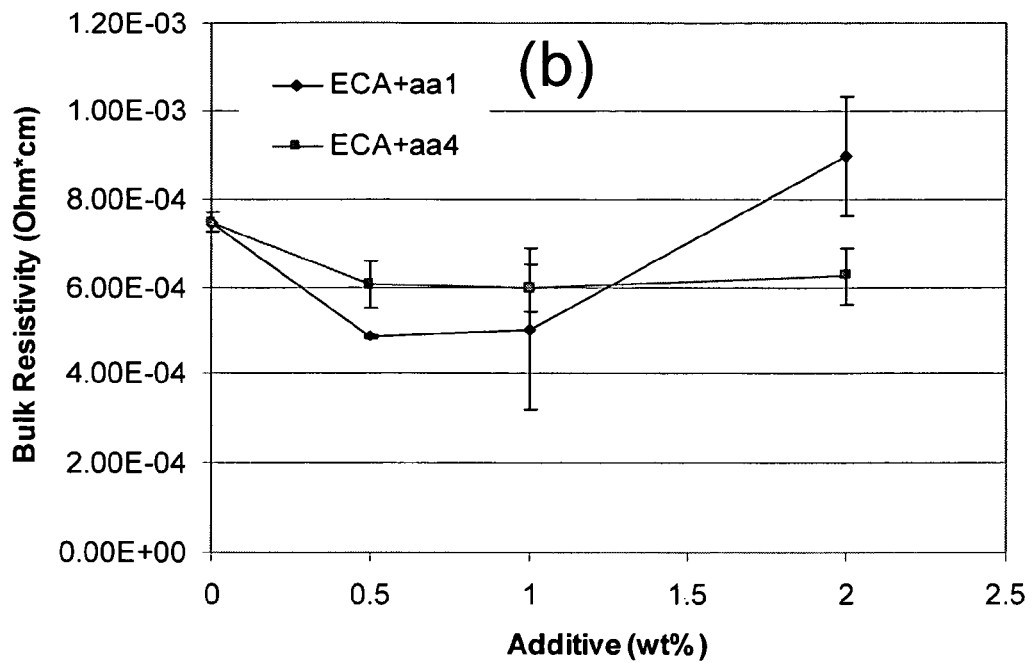

Bulk Resistivity of ECAs with Different Additives: The bulk resistivity data on MECAs without and with different additives are shown in FIG. 3(a). The resistivity of the typical ECA was $7.5 \times 10^{-4}$ Ohm·cm. With the addition of 1 wt % of acid additives, decreased resistivity values were achieved. For aa1, aa2 and aa4 added MECAs, the average values of resistivity were about $5 \times 10^{-4}$, $6.5 \times 10^{-4}$ and $6 \times 10^{-4}$ Ohm·cm, respectively. Since aa1 and aa4 performed best for the improvement of electrical conductivity of MECA, the effect of different loading levels of these additives on the resistivity was studied in FIG. 3(b). With the addition of 0.5 wt % aa1 and aa4, the resistivity decreased by 30-40%. The improved conductivity with small amounts of additives may be due to the premature reaction between the additive and silver flakes. The acid additives, which served as reducing agents and reduced the silver oxides during the curing process, could help maintain good metallic contact and, therefore, lead to a lower resistivity.

Figure 4:
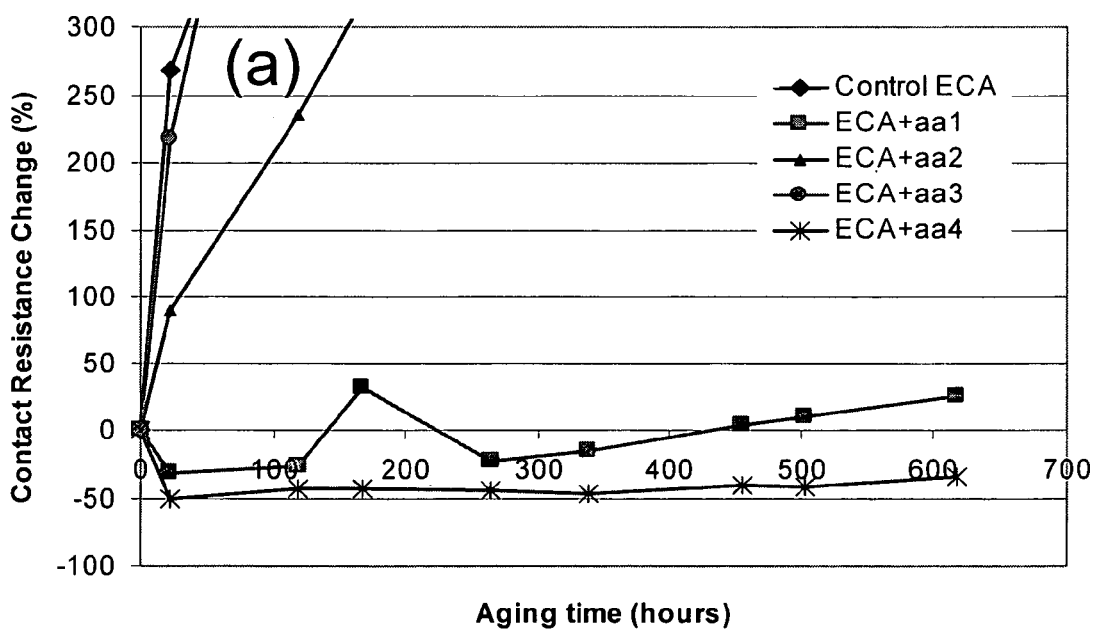
FIG. 4 illustrates the contact resistance of ECAs on Sn surfaces with different additives: a) contact resistance shift under 85° C./85% RH and b) initial contact resistance values.
Figure 4:
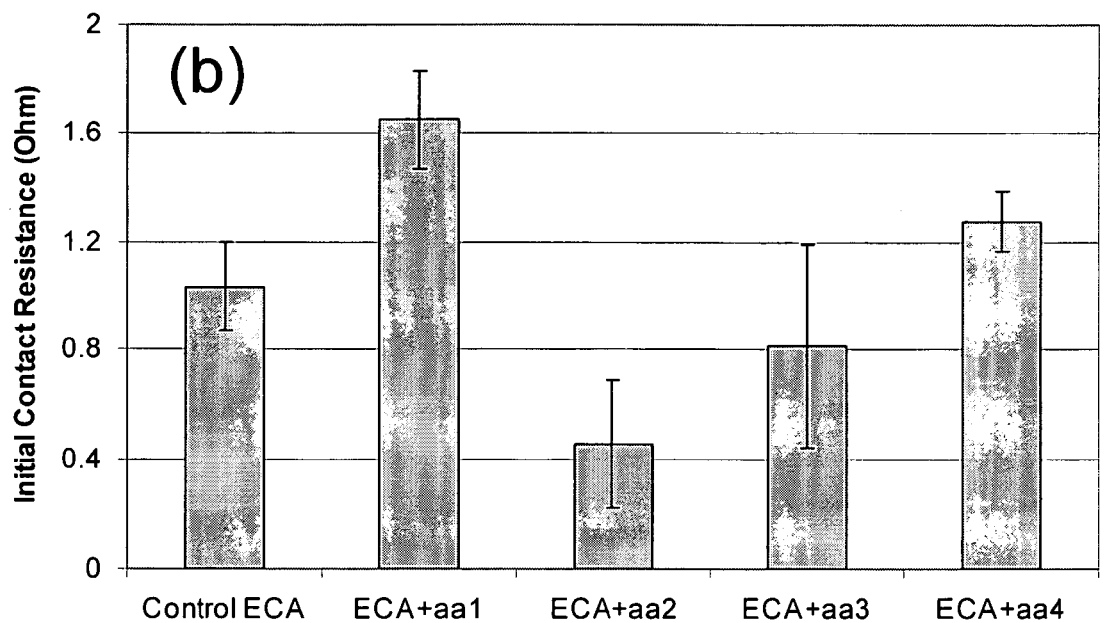

Contact Resistance Shift on Sn Surfaces during 85° C./85% RH Aging: The effects of the additives on the contact resistance of the formulated ECAs were investigated, and the contact resistance shifts of ECAs on Sn surfaces during 85° C./85% RH aging are shown in FIG. 4(a). The Sn surface has been known to be readily oxidized and corroded with aging, and, therefore, a dramatically increased contact resistance for ECA without any additives was observed. Within 24 hours, the contact resistance increased more than 200%. For aa2 and aa3 incorporated MECAs, slightly slower increase of contact resistance was observed in the initial stage of aging. With the addition of aa1 and aa4, on the other hand, significantly stable contact resistance on Sn surfaces was achieved. The contact resistance increase was less than 40% over 600 hours with aa1 addition, while the aa4 added samples showed even a slightly decreased contact resistance on Sn surfaces after 600 hours' aging. Therefore, aa1 and aa4 acted as effective corrosion inhibitors for MECA on Sn surfaces.

To study the possible mechanism for the contact resistance stabilization with these effective corrosion inhibitors, the initial contact resistance values were compared, and the results are shown in FIG. 4(b). For aa1 and aa4 incorporated MECAs, even slightly higher initial contact resistance values than for control were observed. It is considered that the organic corrosion inhibitors formed a passivation layer on the Sn surfaces and protected the surfaces during the aging. But the insulative properties of the organic corrosion inhibitors also led to the slightly higher initial contact resistance values.

Figure 5:
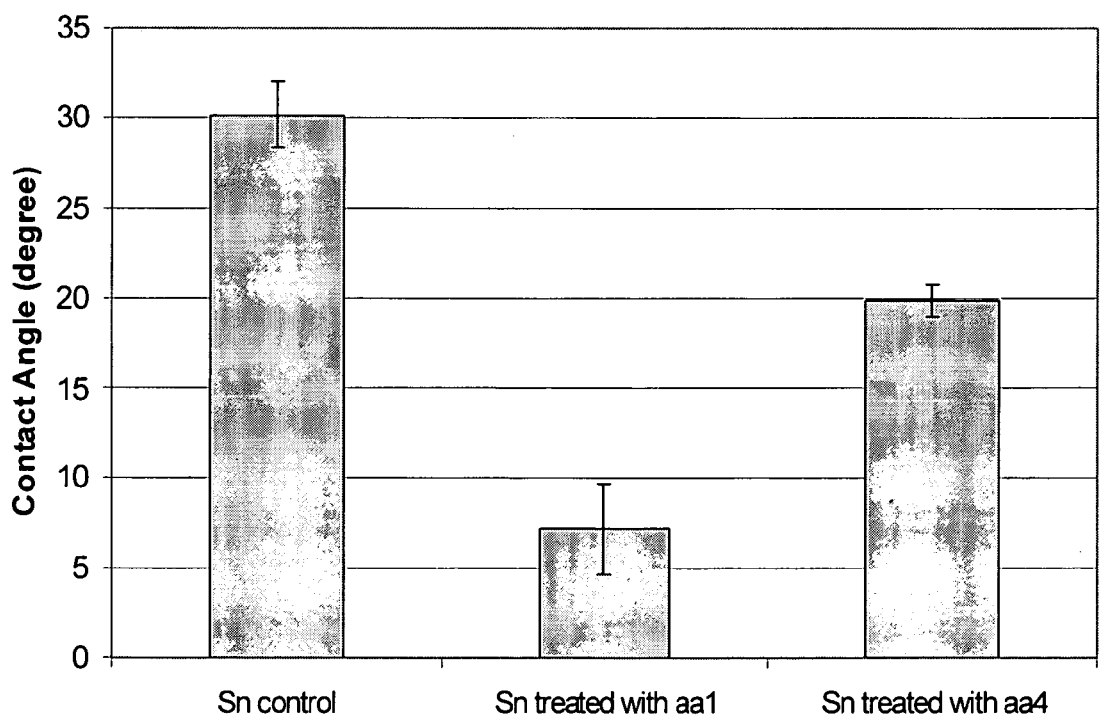
FIG. 5 illustrates the contact angle of DI $H_2O$ on Sn surfaces.
Figure 6:
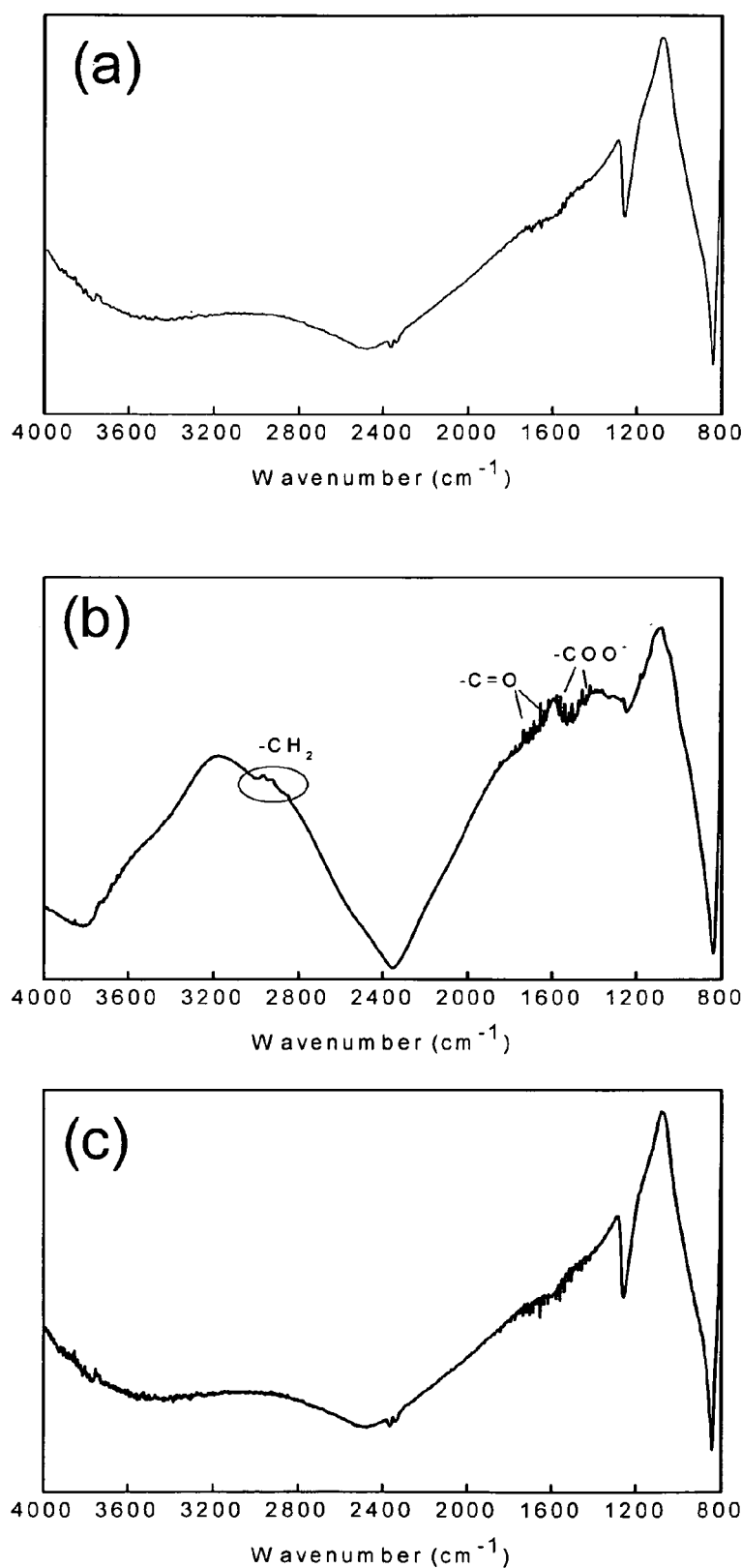
FIG. 6 illustrates FTIR spectra of treated Sn surfaces: a) untreated Sn surface; b) glycine treated Sn surface; and c) dodecanedioic acid treated Sn surface.

Coatings of Effective Corrosion Inhibitors on Sn Surfaces: To characterize the interaction between corrosion inhibitors and Sn finishes, contact angle values of DI water on Sn surfaces before and after treatment in aa1 and aa4 solutions were measured and the results are shown in FIG. 5. The contact angles decreased on the treated Sn surfaces. The decreased contact angle indicated that both types of additives, with hydrophilic functional groups (—COOH or —$NH_2$), had strong affinity to Sn and were well coated on the Sn surfaces. Grazing angle FTIR spectra of the treated Sn surfaces were also recorded. For the aa1 treated Sn surface, typical —$CH_2$ stretching peaks, C═O stretching peaks, and $COO^-$ peaks were detected at around 2900 $cm^{-1}$, 1700 $cm^{-1}$ and 1400 $cm^{-1}$, respectively (FIG. 6(b)). Therefore, aa1 was confirmed to be well coated on the Sn surface. For the aa4 treated surface, however, no obvious peaks were observed. (FIG. 6(c)) The different behaviors of aa1 and aa4 from FTIR spectra could be due to their different structures and, consequently, different alignment modes on Sn surfaces. For aa4, a longer chain di-functional compound, both functional groups could anchor on the Sn surface, and the resultant more flexible molecular structure may prefer to lie flat on the Sn surface rather than standing up. Therefore, no obvious functional groups were detected by FTIR.

Figure 7:
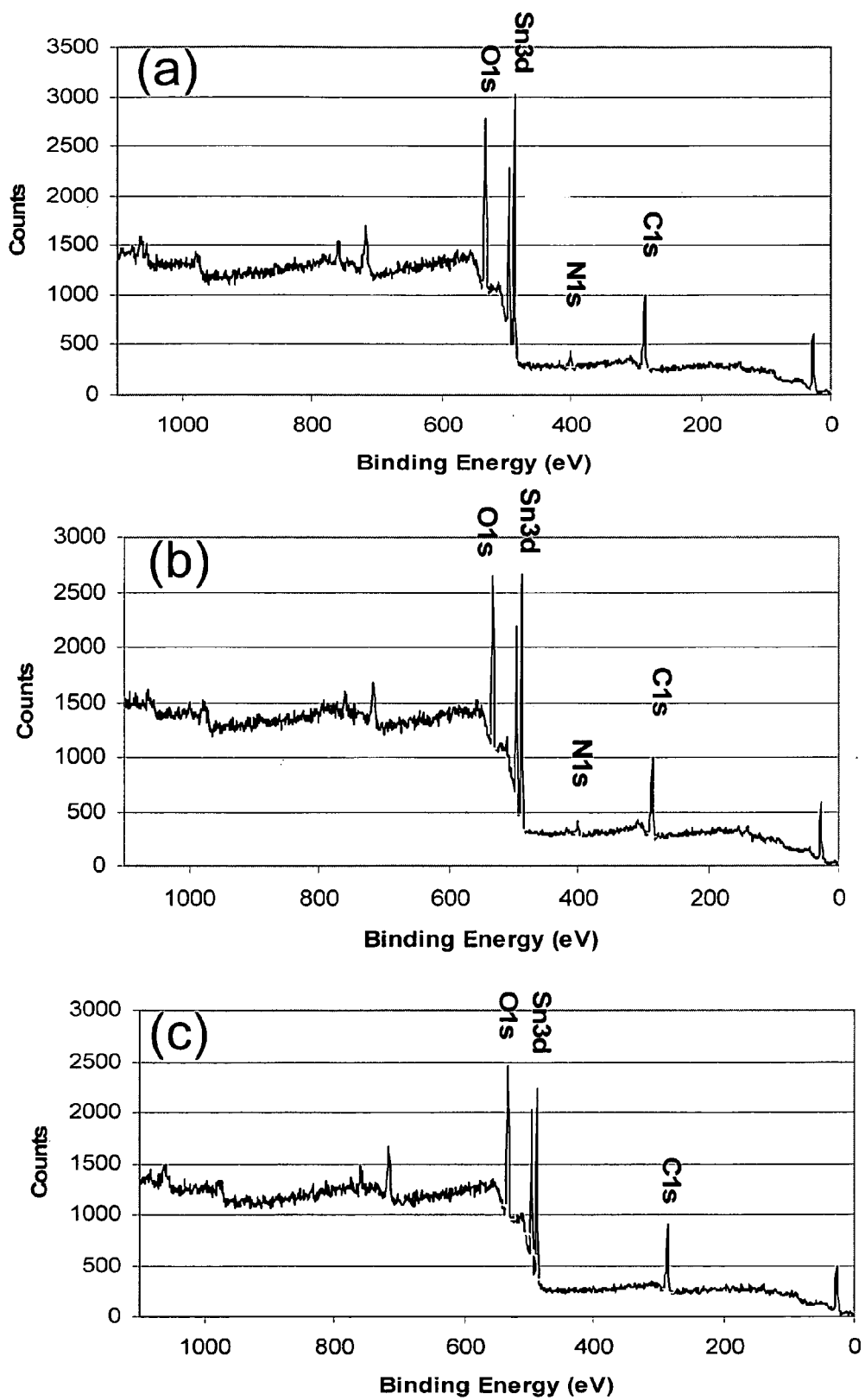
FIG. 7 illustrates the XPS survey scans of Sn surfaces a) untreated Sn surface; b) glycine treated Sn surface; and c) dodecanedioic acid treated Sn surface.
Figure 8:
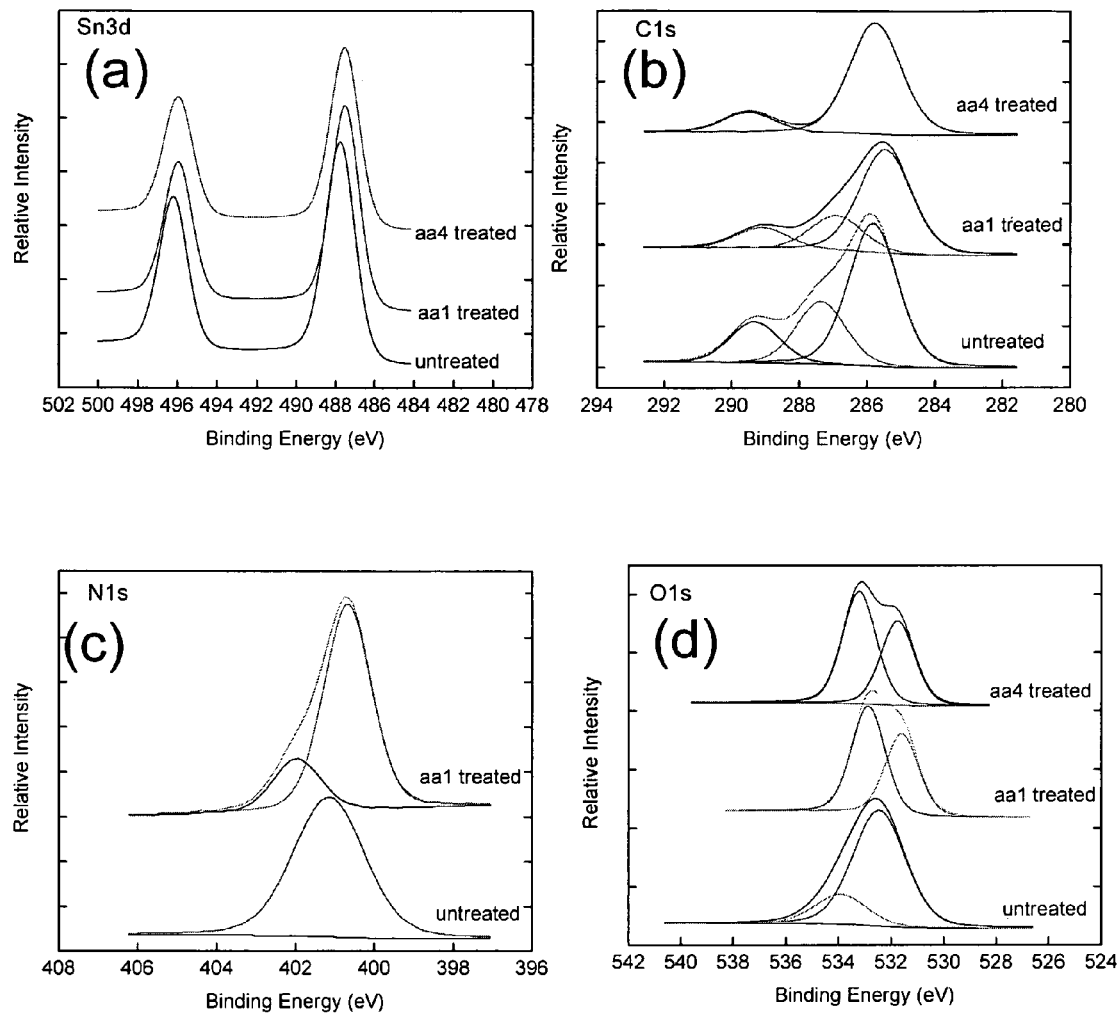
FIG. 8 illustrates high-resolution XPS spectra of a) Sn3d, b) C1s, c) N1s and d) O1s peaks for Sn surfaces.

The XPS spectra provided further information on the surface chemical changes induced by coatings of organic additives on Sn. FIG. 7 and Table 2 show survey scan results of untreated and treated Sn surfaces. From XPS measurements, peaks of $Sn3d_{2/5}$ (~488 eV) and $Sn3d_{2/3}$ (~496 eV), C1s (~285 eV), O1s (~532 eV) were found for all Sn surfaces, while small N1s (~401 eV) peaks were also detected for untreated and aa1 treated Sn surfaces. High resolution spectra of $Sn3d_{2/5}$ and $Sn3d_{2/3}$ peaks showed that the binding energy shifted to slightly lower values after treatment (FIG. 8(a) and Table 2), suggesting that some reaction on the Sn surface had occurred during the treatment. Three C1s peaks were observed for untreated surfaces at 285.8, 287.4 and 289.3 eV, which corresponded to the C—H, C—N and C—O chemical groups, respectively (FIG. 8(b) and Table 3). After treatment in aa1 solution, the bonding energy slightly shifted and the percentage of C—H bonding increased. After aa4 treatment, C—H bonding became more dominant and C—N bonding disappeared. The longer molecular chain that contains more —$CH_2$ functional groups for aa4 contributed to the higher C—H bonding, while the disappearance of C—N bonding is probably due to the reaction between aa4 and the N-containing basic group. From N1s spectra, the N1s peak (401.2 eV) for untreated surface shifted and split into two peaks at 400.7 and 402.0 eV after aa1 treatment, which corresponded to the C—N and N—H bondings, respectively (FIG. 8(c) and Table 3). This change is attributed to the —$NH_2$ functional group in aa1. Corresponding to the disappearance of C—N bonding at 287.4 eV after aa4 treatment, the N1s peak disappeared due to the strong acidity of aa4 and, subsequently, the neutralization reaction with an N-containing basic group. FIG. 8(d) depicts O1s spectra of the same samples. The two peaks for the untreated surface corresponded to C—O and O—O bondings. After treatment, significant change in O1s spectrum was observed. The shifted peaks at ~532 eV and 533 eV with 43:57 ratio were considered to be related to —OH and —O—C═O bondings, respectively, since both aa1 and aa4 have —COOH functional groups.

TABLE 2

XPS Elemental Composition (at %) of Sn Surfaces

| Samples | Sn3d | C1s | O1s | N1s |
|---|---|---|---|---|
| Untreated Sn surface | 9 | 46 | 40 | 5 |
| aa1 treated Sn surface | 8 | 50 | 38 | 4 |
| aa 4 treated Sn surface | 7 | 49 | 44 | 0 |

TABLE 3

High Resolution XPS for results for different Sn surfaces

| Samples | C1s binding energy (eV) | amount (%) | N1s binding energy (eV) | amount (%) | O1s binding energy (eV) | amount (%) | Sn3d binding energy (eV) | amount (%) |
|---|---|---|---|---|---|---|---|---|
| untreated Sn surface | 285.8 | 58 | 401.2 | | 532.5 | 79 | 487.8 | 60 |
|  | 287.4 | 25 | | | 533.9 | 21 | 496.2 | 40 |
|  | 289.3 | 17 | | | | | | |
| aa1 treated Sn surface | 285.5 | 65 | 400.7 | 80 | 531.6 | 43 | 487.5 | 60 |
|  | 286.9 | 22 | 402.0 | 20 | 532.9 | 57 | 496.2 | 40 |
|  | 289.1 | 13 | | | | | | |
| aa4 treated Sn surface | 285.8 | 85 | | | 531.8 | 43 | 487.5 | 60 |
|  | 289.5 | 15 | | | 533.2 | 57 | 495.9 | 40 |

Comparing contact angle, FTIR and XPS results with the contact resistance data, the aa1 and aa4 coatings on Sn surfaces formed a thin passivation layer on the Sn substrate, which resulted in isolation of the Sn surface from the environment. Therefore, the Sn surfaces were protected. The slightly higher initial contact resistance values (FIG. 4(b)) also indicated the formation of the organic layer since both types of organic corrosion inhibitors are non-conductive and thus could increase the initial contact resistance.

Figure 9:
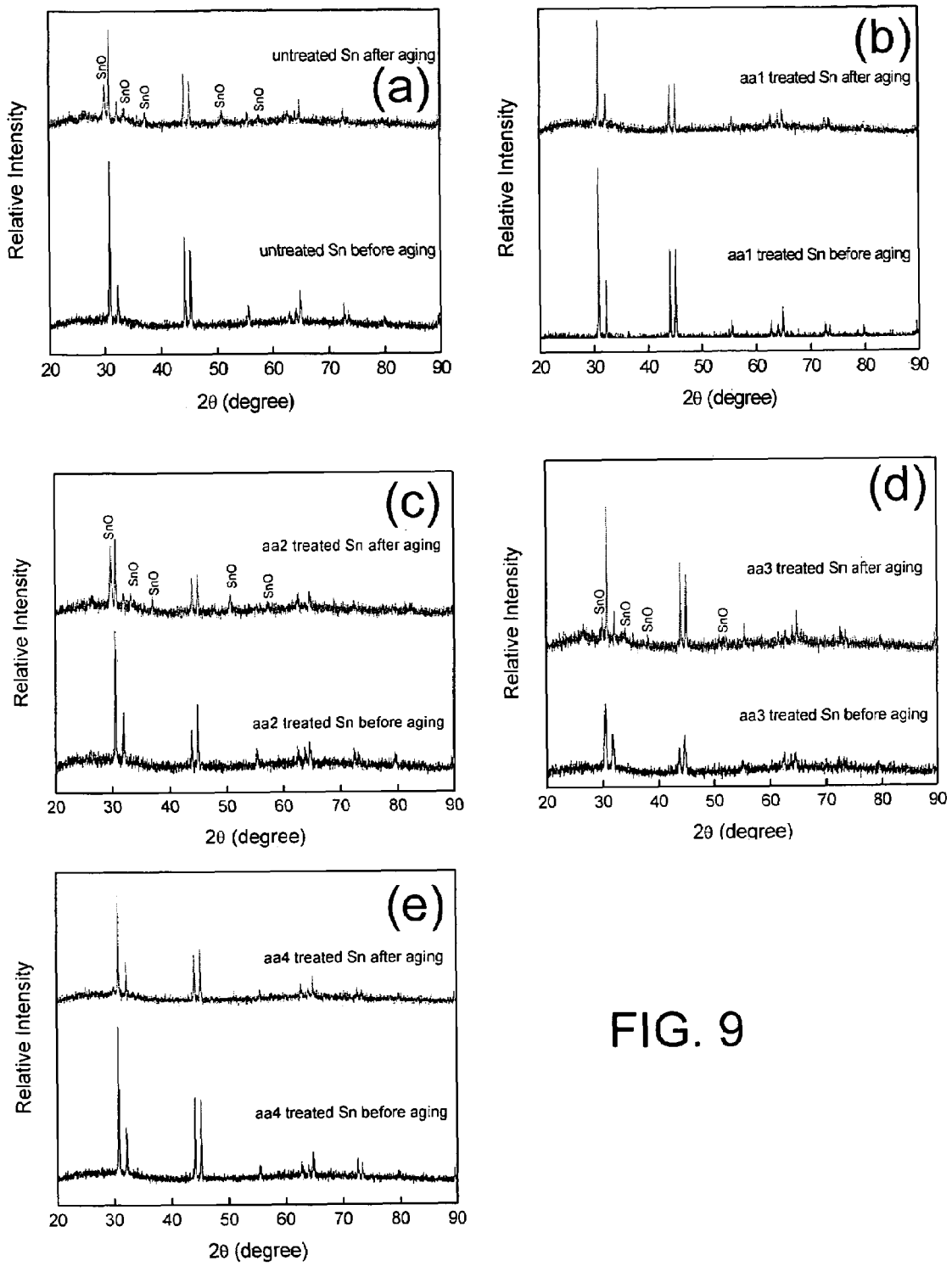
FIG. 9 illustrates XRD patterns of Sn surfaces before and after 85° C./85% RH aging: a) untreated Sn surface; b) glycine treated Sn surface; c) lysine treated Sn surface; d) aspartic acid treated Sn surface; and e) dodecanedioic acid treated Sn surface

X-Ray Diffraction of Sn Surfaces Under Accelerated Temperature and Humidity: FIG. 9 shows the XRD results for Sn surfaces before and after the aging test. For all the samples, only Sn (JCPDS card no. 04-0673.) was detected before aging. To accelerate the oxidation process at elevated temperature and humidity, the Sn surfaces were placed in a Highly Accelerated Stress Testing (HAST, 121° C., 2 atm, 100% RH) chamber for 72 hours. After the HAST test, obvious extra peaks corresponding to SnO (JCPDS afd no. 01-0902) were detected for untreated, aa2 and aa3 treated Sn surfaces due to the oxidation of these Sn surfaces. For the aa1 and aa4 treated surfaces, however, no SnO peaks were observed. Similar results were also obtained for the 85° C./85% RH aged Sn surfaces. Therefore, the addition of aa1 and aa4 was confirmed to be able to protect the Sn-finished test boards and prevent the formation of oxides during the aging test.

CONCLUSION

The effects of different additives on the electrical properties of MECA/Sn joints were investigated. These additives have strong affinity to Sn finishes and form a passivation layer on the Sn surfaces. The passivation layer that acted as a barrier between the Sn surface and the environment prevented the Sn pad surface from oxidation and corrosion during the elevated temperature and humidity environment. This protection capability of the additives led to stable contact resistance and, consequently, a significantly improved reliability in the aging test. The bulk resistance was also slightly decreased by using these additives.

It should be emphasized that the above-described embodiments of the present disclosure are merely possible examples of implementations and are merely set forth for a clear understanding of the principles of the disclosure. Many variations and modifications may be made to the above-described embodiments. All such modifications and variations are intended to be included herein within the scope of this disclosure and protected by the following claims.

The invention claimed is:

1. A composition, comprising:
   an electrically conductive adhesive (ECA); and
   a corrosion inhibitor additive, wherein the cured composition has a contact resistance that changes less than about 20% after 500 hours' aging at 85° C./85% relative humidity,
   wherein the corrosion inhibitor additive is selected from phosphonobutanetricarboxylic acid, benzenetricarboxylate, or combinations thereof.

2. The composition of claim 1, wherein the composition has a bulk resistivity from about $10^{-2}$ Ohm-cm to $10^{-6}$ Ohm-cm.

3. The composition of claim 1, wherein the composition has a coefficient of thermal expansion (CTE) before the glass transition temperature (Tg) is reached of about 10 parts per million (ppm)/° C. to 80 ppm/° C.

4. The composition of claim 1, wherein the composition has a glass transition temperature (Tg) about from 80° C. to 150° C.

5. A modified electrically conductive adhesive, comprising:
   a matrix resin;
   a cross-linking agent;
   a conductive filler; and
   a corrosion inhibitor additive,
   wherein the corrosion inhibitor additive is selected from phosphonobutanetricarboxylic acid, benzenetricarboxylate, or combinations thereof, and, wherein the cured composition has a contact resistance that changes less than about 20% after 500 hours' aging at 85° C./85% relative humidity.

6. The modified electrically conductive adhesive of claim 5, wherein the cured, modified electrically conductive adhesive has: a bulk resistivity from about $10^{-2}$ Ohm-cm to $10^{-6}$ Ohm-cm, a coefficient of thermal expansion (CTE) before the glass transition temperature (Tg) is reached ($\alpha 1$) of about 10 parts per million (ppm)/° C. to 80 ppm/° C., and a glass transition temperature (Tg) of about from 80° C. to 150° C.

7. The modified electrically conductive adhesive of claim 5, wherein the matrix resin is about 2 to 99 by weight percent of the modified electrically conductive adhesive, the cross-linking agent is about 1 to 50 by weight percent of the modified electrically conductive adhesive, the conductive filler is about 5 to 95 by weight percent of the modified electrically conductive adhesive, and the corrosion inhibitor is about 0.01 to 10 by weight percent of the modified electrically conductive adhesive.

8. The modified electrically conductive adhesive of claim 5, wherein the conductive filler is selected from: a metal selected from silver, nickel, copper, aluminum, palladium, platinum, gold, combinations thereof, and alloys thereof; a carbon black; a carbon fiber; a carbon nanotube; graphite; and combinations thereof.

9. The modified electrically conductive adhesive of claim 5, wherein the matrix resin is selected from bisphenol-A type epoxy resins, bisphenol-F type epoxy resins, cycloaliphatic epoxy resins, epoxy novolac resins, biphenyl type epoxy resins, naphthalene type epoxy resins, dicyclopentadiene-phenol type epoxy resins, and combinations thereof.

\* \* \* \* \*